(12) United States Patent
Rauscher et al.

(10) Patent No.: US 7,833,506 B2
(45) Date of Patent: Nov. 16, 2010

(54) PROCESS FOR THE SYNTHESIS OF NANOSIZE METAL-CONTAINING NANOPARTICLES AND NANOPARTICLE DISPERSIONS

(75) Inventors: Frank Rauscher, Köln (DE); Verena Haverkamp, Bergisch Gladbach (DE); Björn Henninger, Köln (DE); Leslaw Mleczko, Dormagen (DE)

(73) Assignee: Bayer Technology Services GmbH, Leverkusen (DE)

( * ) Notice: Subject to any disclaimer, the term of this patent is extended or adjusted under 35 U.S.C. 154(b) by 0 days.

(21) Appl. No.: 12/515,706

(22) PCT Filed: Nov. 8, 2007

(86) PCT No.: PCT/EP2007/009677

§ 371 (c)(1),
(2), (4) Date: Aug. 5, 2009

(87) PCT Pub. No.: WO2008/061632

PCT Pub. Date: May 29, 2008

(65) Prior Publication Data
US 2009/0295005 A1 Dec. 3, 2009

(30) Foreign Application Priority Data
Nov. 21, 2006 (DE) .................. 10 2006 055 218

(51) Int. Cl.
*C01B 19/04* (2006.01)
*C01B 25/08* (2006.01)

(52) U.S. Cl. ............. 423/509; 423/299; 977/762; 977/773; 977/818; 977/824

(58) Field of Classification Search ............ 423/509, 423/561.1, 299; 977/672, 773, 818, 824
See application file for complete search history.

(56) References Cited

U.S. PATENT DOCUMENTS
6,179,312 B1 1/2001 Paschke (Continued)

FOREIGN PATENT DOCUMENTS
EP 1452225 A 9/2004

(Continued)

OTHER PUBLICATIONS

Nakamura H; Application of a microfluidic reaction system for CdSe nanocrystal preparation: their growth kinetics and photoluminescence analysis, Lab on a Chip, 20040601 Royal Society of Chemistry, Cambridge, vol. 4, Nr:3, pp. 237-240.

(Continued)

*Primary Examiner*—Timothy C Vanoy
(74) *Attorney, Agent, or Firm*—Norris McLaughlin & Marcus, PA

(57) ABSTRACT

The invention relates to a process for producing morphologically uniform and virtually monodisperse metal-containing nanoparticles, characterized in that the separation both in time and space of the nucleation and growth processes is achieved by regulation of the temperature and volume flows, with the reaction and particle formation preferably being initiated and carried out in a suitable microstructured modular reactor system. Modularization of the microreaction plant (micro heat exchanger, residence reactor, micromixer, etc.) allows optimal setting of the respective chemical and process-engineering process parameters and thus the preparation of virtually monodisperse and morphologically uniform nanoparticles.

14 Claims, 8 Drawing Sheets

U.S. PATENT DOCUMENTS

Figure 1:
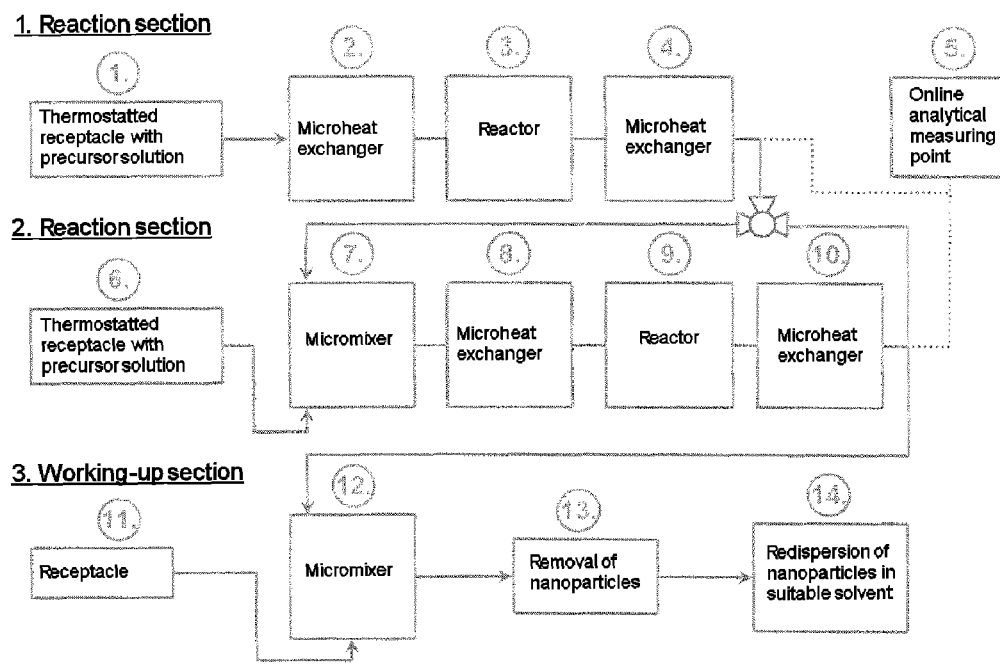

| | | | |
|---|---|---|---|
| 7,267,810 B2 * | 9/2007 | Yu et al. | 423/508 |
| 7,393,516 B2 * | 7/2008 | Seo et al. | 423/508 |
| 2004/0247517 A1 | 12/2004 | Zehnder | |
| 2005/0016851 A1 | 1/2005 | Jensen | |
| 2005/0112849 A1 | 5/2005 | Stott | |

FOREIGN PATENT DOCUMENTS

| | | | |
|---|---|---|---|
| WO | 9710175 A1 | 3/1997 | |
| WO | 9802237 A2 | 1/1998 | |
| WO | 0107689 A2 | 2/2001 | |
| WO | 2005020659 A2 | 3/2005 | |
| WO | 2005052996 A2 | 6/2005 | |

OTHER PUBLICATIONS

T. Trintade et al., Chem. Mater., 2001, 13, 3843-3858.
C. Burda et al., Chem. Rev., 2005, 105, 1025-1102.
B.K.H. Yen et al., Angew. Chem. Int. Ed., 2005, 44, 5447-5451.
C. B. Murray et al., J. Am. Chem. Soc., 1993, 115, 8706-8715.
C. de Mello et al., Small, 2005, 1, 1152-1162.
J. de Mello et al., Lab Chip, 2004, 4, 11N-15N.
H. Nakamura et al., Lab Chip, 2004, 4, 237-240.
M. Kawa et al., J. Nanopart. Res., 2003, 5, 81-85.

* cited by examiner

PROCESS FOR THE SYNTHESIS OF NANOSIZE METAL-CONTAINING NANOPARTICLES AND NANOPARTICLE DISPERSIONS

This application is a 371 application of PCT/EP2007/009677 filed Nov. 8, 2007, which claims priority to the German application 10 2006 055 218.0 filed Nov. 21, 2006.

The present invention relates to a process for preparing nanoscale semiconductor particles (also known as quantum dots or nanocrystals) in the liquid phase with utilization of specially dimensioned microstructured reaction modules such as heat exchangers, reactors and mixers.

Besides the classical fields of use of functional nanoscale particles, for example in catalysis or as pigments, the focus these days is increasingly on high tech applications in biotechnology, medicine, security technology, computer technology, electrical engineering and energy technology as well as optics. In addition, a variety of possible applications and uses exists in the material sciences because functional nanoparticles can help composite materials to acquire completely new properties. Controlling the product properties, inter alia particle morphology, particle size, particle size distribution, colloidal stability of dispersions and use properties of the particles, is decisive for the particular special applications. The physico-chemical properties, especially of semiconductor nanoparticles, vary very greatly as a function of particle size, particle morphology and particle size distribution range. Therefore, controlled synthesis which allows particle properties to be set specifically is particularly important (T. Trintade et al., Chem. Mater., 2001, 13, 3843-3858; C. Burda et al., Chem. Rev., 2005, 105, 1025-1102).

Nanoscale semiconductor particles can be prepared by means of gas phase syntheses which, however, are hardly suitable for preparing larger amounts, due to the complexity of apparatus and of the proposed processes.

Another possible preparation process is the liquid phase synthesis of nanoscale semiconductor particles. These liquid phase processes which utilize either water (hydrothermal) or organic solvents (solvothermal) may be carried out both batchwise and continuously.

The batch processes have been studied most extensively. These processes start from either one or more precursor solutions which are then to be mixed. Differences exist inter alia in the type of solvent used, surfactants, precursors used and of the metering and reaction temperatures.

C. B. Murray et al. have described for the first time a solvothermal batch process for preparing virtually monodispersely distributed semiconductor nanoparticles (C. B. Murray et al., J. Am. Chem. Soc., 1993, 115, 8706-8715). Here, a pure surfactant solution is used as reaction medium for the synthesis. A thermostatted stirred tank reactor is initially charged with a precursor in solution under an inert atmosphere and heated to the desired temperature. The second precursor solution is then added to the first precursor solution as quickly as possible, with intensive stirring and simultaneous lowering of the temperature ("hot injection" method).

C. de Mello et al. give an overview of customary process conditions and solvents and surfactants used for this "hot injection" method for synthesizing semiconductor nanoparticles (C. de Mello et al., Small, 2005, 1, 1152-1162).

Semiconductor nanoparticles are prepared in a batch process, usually by using a coordinating solvent (e.g. trioctylphosphine oxide, TOPO), in order to have the particle formation process run under controlled conditions. After metering in a second precursor solution to a thermostatted first precursor solution ("hot injection" method), the reaction mixture is allowed to cool down to a particular temperature, so that the growth process and the nucleation process do not take place in parallel (for this, see for example WO 2001007689 A2, U.S. Pat. No. 6,872,249).

U.S. Pat. No. 6,576,291 describes the mixing of two precursor solutions using suitable surfactants (e.g. trioctylphosphine, TOP) at room temperature and subsequent rapid addition of this mixture to a pure surfactant/solvent mixture heated to 360° C. Here too, the temperature is lowered to 275° C. after the metering-in step, for controlled and slow growth of the semiconductor nanoparticles.

WO 1997010175 moreover describes the formation of an organic precursor from the components necessary for particle formation by means of a comproportionation reaction (ligand metathesis). After mixing this precursor into a surfactant/solvent mixture, the entire contents of the reactor are heated as quickly as possible to the temperature required for particle formation, 250° C., and maintained at this temperature for 30 minutes.

Batch processes are also suitable for synthesizing "core/shell nanoparticles", with synthesis of the core nanoparticles being carried out first after previously described methods. This is followed by adding in a second step the corresponding precursor solution for synthesizing the shell at temperatures of approx. 220° C. (for this, see for example U.S. Pat. No. 6,207,229, U.S. Pat. No. 6,815,064).

U.S. Pat. No. 6,225,198 describes the possibility of the shape of the nanoparticles also being influenced by precursor concentration, reaction temperature and specific properties of the surfactants used and of the precursor solution in the batch process, as a result of which 1D, 2D and 3D structures can also be synthesized in addition to 0D structures.

Decisive for a controlled formation of semiconductor nanoparticles are inter alia a very homogeneous temperature field in the reactor, a stable reaction temperature, the possibility of very rapid heat supply and heat dissipation and, in the case of metering in a second precursor solution, efficient mixing. In discontinuous processes, the quality of temperature control and of mixing deteriorates as a function of an increase in the total reaction volume, and as a result these processes usually allow only the synthesis of small amounts of these semiconductor nanoparticles (1-50 ml reaction mixtures). In order to produce larger amounts, batch syntheses must therefore be carried out in parallel or in succession, with considerable effort. Process parameter fluctuations during the individual syntheses then inevitably result in a loss of quality.

In order to prepare nanoparticles with a very monodisperse distribution, the "nucleation process" is expediently decoupled in time from the subsequent growth process (J. de Mello et al., Lab Chip, 2004, 4, 11N-15N).

In addition, separating the nucleation and growth processes in space could enable the ideal particular process parameters to be precisely adjusted and thereby the particle properties to be optimally controlled. However, separation in space is not possible in batch processes. A continuous synthesis which enables the nucleation and growth processes to be separated both in time and in space has not been disclosed thus far, although it could offer inherent advantages over the established batch operation (batch synthesis).

Moreover, the fact that the surfactants and solvents normally used contribute considerably to the costs of the synthesis is another inhibitory factor for preparation of larger amounts of these semiconductor nanoparticles.

WO 2005052996 describes the use of inexpensive heat transfer fluids (e.g. Dowtherm A) as reaction medium for batch synthesis. In addition to the non-coordinating solvents sometimes used hitherto, such as octadecene, this can again reduce costs considerably.

First attempts of utilizing continuously operated reactors for the synthesis of semiconductor nanoparticles, led to the use of thin capillaries which were immersed in an oil bath and heated to the required temperatures. In this case, the precursor solutions are pre-mixed using coordinating solvents and delivered at slightly elevated temperatures to the capillary thermostatted to up to 330° C. (H. Nakamura et al., Lab Chip, 2004, 4, 237-240). However, by using a uniformly thermostatted capillary, it is not possible to separate nucleation and growth sufficiently from one another in time and space.

Various other functional nanoparticles have also been prepared in a continuous manner in capillary reactors. In all cases, the capillary serves to thermostat the reaction solution in order to initiate the reaction and subsequent particle formation.

EP1452225 A1 describes the synthesis of gold, cadmium sulphide and cadmium selenide nanoparticles.

U.S. Pat. No. 6,179,912 describes a continuous process for preparing various semiconductor nanoparticles, utilizing a plurality of mixing sections with the use of coordinating solvents (TOPO), in order to mix the precursor solution prior to introducing the latter to the reactor continuously operated at greatly elevated temperatures. This requires heating also even the receptacles and the mixing sections, since the solvent used is a wax-like solid at room temperature.

Similarly to the batch synthesis procedure, it is also possible in continuous operation for the two precursors to be metered in into a surfactant solution (TOPO) previously thermostatted to the required temperature (M. Kawa et al., J. Nanopart. Res., 2003, 5, 81-85).

U.S. Pat. No. 5,652,192 describes a continuous process for synthesizing nanoscale particles in an aqueous phase with utilization of a thermostatted and (hydrothermally) pressurized, continuously operated reactor.

WO 2005020659 describes the combination of a mixer, heating section and residence time section in a component for synthesizing nanoscale particles. The use of a plurality of metering-in sites thus also allows coating of nanoparticles (preparation of core-shell particles).

In order to balance the evident disadvantages of the capillary processes, such as insufficient separation of nucleation and growth phases, extremely low volume flows, insufficient mixing of reactant flows, broad residence time distributions due to the laminar flow profile and broad particle size distributions resulting therefrom, "segmented flow" concepts are also used for synthesizing functional nanoparticles (B. K. H. Yen et al., Angew. Chem. Int. Ed., 2005, 44, 5447-5451). This involves using a segmenting fluid (gas or non-miscible liquid) in order to generate discrete reaction volumes which are subject to natural circulation in a continuous-flow reactor.

WO 998002237 generally describes carrying out precipitation reactions for the synthesis of solid particles in a segmented-flow tube reactor. Mixing of the two reactants here can either precede or be at the same time as segmentation.

Compared to running the reaction in a capillary reactor, the utilization of segmented-flow reactors yields nanoparticles with a distinctly narrower particle size distribution. However, here too the quality of the nanoparticles with respect to size distribution decreases markedly, if volume flow throughputs (ml/min) are to be increased, thereby producing larger amounts of nanoparticles. Furthermore, the degree of complexity of the process increases, since the segmentation fluid must be metered in very precisely and evenly. This is virtually impossible with higher volume flows.

Therefore, alternative processes are needed which are suitable for cost-effective liquid phase synthesis of larger amounts of nanoscale semiconductor particles with specifically adjustable particle size and particle size distribution. This relates in particular to processes in which concentrated and colloidally stable (i.e. with higher lifetimes, in particular of a few hours up to several days) particle dispersions can be produced reproducibly and on an industrial scale and which do not have the said disadvantages of the established processes.

The object of the present invention was therefore to provide a process, and in particular a continuous process, for preparing nanoscale semiconductor particles or other metal-containing functional nanoparticles and/or their dispersion, which makes possible run times in the hour range and in particular in the day range. Moreover, this process is intended to provide the said products in the desired quality, i.e. with specifically adjustable average particle size, virtually monodisperse particle size distribution and desired particle morphology, in larger amounts and in particular in the range of g/h and more.

The object is achieved by the present process according to the invention in a continuous-flow reaction section consisting of a plurality of suitable reaction modules, wherein the nucleation and growth processes are separated in time and space by using preferably microstructured reaction modules with separate temperature control.

The process is preferably carried out in a reactor which, for example by incorporating static mixers, allows good radial and low axial mixing and thereby enables a narrow residence time distribution to be set. The liquid phase process according to the invention is preferably carried out in a microreaction technology system which, compared to conventional reaction technology, allows temperature and mixing conditions to be regulated and controlled very precisely.

For the purposes of the present invention, a microreaction technology system means a modular system composed of a plurality of microreaction technology components. A microreaction technology system usually consists of at least one microstructured reactor. The liquid phase process according to the invention is preferably carried out continuously.

Surprisingly, the abovementioned process was found to be able to produce metal-containing nanoparticles, in particular semiconductor nanoparticles, with desired particle size, particle size distribution and particle morphology, continuously in a modular microreaction technology system, using suitable organic solvents. Surprisingly it was also found that, with the use of suitable solvents, the corresponding precursors can be pre-mixed at room temperature or slightly elevated temperature (in particular $\leqq 100°$ C.) and therefore be passed as a single strand, mixed thoroughly down to the molecular level, through the microreaction technology system heated to the reaction temperature. Strand, reaction strand or reaction section mean for the purposes of the process according to the invention a sequential series connection of reaction modules.

The temperature for pre-mixing of the precursors is preferably chosen in such a way that no significant chemical reaction and nucleation can take place in the receptacle and in the supply lines. This may be determined, for example, by monitoring the colour or clouding of the precursor solution in the receptacle. In addition, the extremely high heat transfer rates in microreaction technology components in combination with thermostattable microstructured residence time reactors with static mixing internals were found to enable the nucleation and growth processes to be separated in time and space, resulting in specific particle sizes or particle morphologies and narrow particle size distributions of the semiconductor nanoparticles. Controlling the nucleation and growth processes separated in time and space then enables particle size, particle size distribution and particle morphology to be specifically adjusted, thereby enabling 0D, 1D, 2D and 3D structures to be synthesized selectively, with 0D structures being spherical nanoparticles, 1D structures being for example rods, 2D structures being for example plates and 3D structures being for example tetrapods or branched nanostructures.

More specifically, it was found that the growth process and therefore the synthesis of complex structures (2D and 3D) can be controlled by the surfactants used, the absolute concentrations of the reactants and surfactants, by the molar ratios of the particular reactants to one another and by precisely controlling the temperature during nucleation and during the growth phase, in particular with the aid of suitable heat transfer area-to-reaction volume ratios (A/V ratios).

The invention therefore relates to a preferably continuous process for preparing, in particular, morphologically uniform and virtually monodispersely distributed, metal-containing nanoparticles and/or nanoparticle dispersions, characterized in that separate control of temperature and volume flows results in separation of the nucleation and growth processes in time and space, with the reaction and particle formation being initiated and carried out preferably in a suitable microstructured, modular reactor system (microreaction technology system). Modularization of the microreaction technology system (microheat exchanger, microreactor, micromixer, etc.) allows the particular chemical and process-engineering process parameters to be optimally adjusted and thereby virtually monodispersely distributed and morphologically uniform nanoparticles to be prepared.

At the same time, the process according to the invention allows continuous preparation of larger amounts of these nanoparticles (in the g/h-kg/h range).

Preferably, the process according to the invention can produce nanoscale particles having a characteristic average particle size of up to 40 nm, in a preferred embodiment of from 0.5 to 20 nm, and in a very particularly preferred embodiment particles with characteristic dimensions of from 1 to 10 nm, characteristic dimension meaning the property-determining dimension, for example the diameter of rods or the diameter of tetrapod arms.

The particle size distribution which can be achieved has usually a standard deviation of ±10 nm, preferably of ±5 nm and particularly preferably of ±2 nm. A particle size distribution may be established and evaluated, for example, by a statistical analysis of transmission electron microscope images.

The process according to the invention furthermore enables particle properties of spherical and in particular non-spherical particles, such as for example rods, plates or tetrapods, to be set. More specifically, the process according to the invention allows a property distribution having a standard deviation of ±20%, preferably of ±10% and in particular of ±5%, to be set. An interesting property may be, for example, UV-vis absorbance maximum, refractive index or melting temperature.

The nanoparticles are synthesized in the liquid phase with the aid of surfactants. The particle surface is permanently covered by a surfactant layer during the particle-forming process and also after completion thereof. Besides a stabilizing action, the surfactant layer also allows the nanoparticles to be removed and redispersed without problems in most organic solvents (e.g. toluene, cyclohexane, tetrahydrofuran, chloroform, methylene chloride), in order to enable further processing or handling or to prepare colloidally stable particle dispersions.

The process according to the invention, owing to the continuous mode of operation, furthermore permits ready transfer from a laboratory scale to a production scale, simultaneously maintaining the product quality achieved in the laboratory.

Preferably, the process enables nanoparticles, in particular functional nanoparticles such as, for example, metal oxides or colloidal precious metals, and particularly preferably semiconductor nanoparticles (e.g. II-VI or III-V compound semiconductors), to be synthesized.

The process particularly preferably enables semiconductor nanoparticles (e.g. II-VI or III-V compound semiconductors) of various forms (spherical particles, rods, plates, tetrapods, core-shell or doped nanoparticles) and sizes to be synthesized continuously in a suitable organic reaction medium.

The reactants employed in the present process are usually metallic reactants such as, for example, Cd, Zn, In, Pb, Ga, Cu, Sn, Mn, Fe, Ti, metal oxides or salts thereof (reactant 1), and Se-, Te-, As-, S-, P-, O-containing compounds (reactant 2). The reactants are used in a dissolved form (precursor solutions) in the process according to the invention.

For the purposes of the present process according to the invention, precursor solution means a homogeneous mixture consisting of reactant, surfactant or surfactant mixture and organic reaction medium.

The preparation of the precursor solutions usually requires surfactants.

Long-chain fatty acids, for example oleic acid, linoleic acid, stearic acid, palmitic acid, tetradecanoic acid, undecanoic acid, etc., are particularly suited as surfactants and to form the corresponding precursor solution 1 of the metallic reactant (reactant 1).

Suitable as surfactants and for forming the corresponding precursor solution 2 of the further reactant (reactant 2) are in particular:

Suitable as surfactants and for forming the corresponding precursor solution 2 of the further reactant (reactant 2) are in particular:

- linear or branched alkylphosphanes, for example tri-butylphosphane, tri-hexylphosphane, tri-octylphosphane, tri-(tert-butyl)phosphane, tris-(trimethylsilyl)phosphane,
- tri-octylphosphane oxide and phosphonic and carboxylic acids, for example tetradecylphosphonic acid, octadecylphosphonic acid,
- quaternary ammonium compounds and amines, for example cetyltrimethylammonium bromide
- alkyl ether carboxylates and salts of fatty amines
- oligothiophenes functionalized with coordinating groups, and
- non-symmetrically substituted perylenes with coordinating groups.

In the process according to the invention, preference is given to reaction media that allow mixing of the precursor solutions at room temperature or at a temperature at which the reaction and nucleation do not take place to a significant extent, that have a very high boiling point of at least 270° C. and that exhibit no signs of degradation at temperatures of up to 350° C.

Preference is given to reaction media which dissolve completely both the reactants (precursors) and the surfactants.

Suitable as reaction medium are in particular, but not exclusively, organic solvents with a high boiling point, such as, for example:
- tri-octylphosphane oxide (TOPO),
- octadecene (ODE),
- silicone oils, alkylaromatics, alkyl phenyl ethers, partially hydrogenated bi-, ter- and polyphenyls or mixtures thereof, and other heat transfer fluids (e.g. Diphyl THT, Diphyl DT or Therminol 66).

Using a suitable solvent, the corresponding precursor solutions may be initially introduced as a homogeneous mixture at slightly elevated temperatures, but no more than 150° C., preferably no more than 120° C. and particularly preferably no more than 100° C., and passed as a single strand through the reaction apparatus. Chemical reaction and nucleation here occur only in the stages of the reaction apparatus that have been heated to the corresponding temperature, rather than in the thermostatted receptacles.

Alternatively, the precursors may also be mixed using mixers having microstructured internal mixing structures (e.g. micromixer) which allow efficient and rapid mixing.

By specifically varying the chemical and process-engineering parameters (surfactants, concentrations, molar concentration ratios, temperatures, volume flows, etc.), the process enables particle size, particle size distribution and particle morphology to be set precisely.

The chemical parameters here relate especially to the composition of the precursor solutions, i.e. selection of the surfactants used and determination of the concentrations and molar concentration ratios of reactants and surfactants to one another.

In a first embodiment of the process according to the invention, synthesis is carried out starting from a fully homogenized, with respect to temperature and concentration, mixture of both precursor solutions, which does not show any significant reactions and in particular any nucleation at temperatures of below 100° C.

According to the invention, preference is given to using as precursor solution 1 a solution of reactant 1, at least one metal-containing reactant, solvent and at least one surfactant 1 (preferably long-chain fatty acids). Preference is given to using as precursor solution 2 a solution of Se-, Te-, As-, S-, P-, O-containing compounds, solvent and at least one surfactant 2 (preferably a tri-alkylphosphane or a functionalized oligothiophene).

The surfactants are used expediently at a concentration of between 0.1 M and 2 M, preferably between 0.2 M and 1.25 M, and in particular between 0.4 M and 1.0 M, in the precursor solutions.

The metal-containing reactants in precursor solution 1 are expediently used at a concentration of between 0.001 M and 2 M, preferably between 0.01 M and 1.0 M and in particular between 0.01 M and 0.5 M.

Precursor solution 2 expediently employs Se-, Te-, As-, S-, P-, O-containing compounds at a concentration of between 0.001 M and 2 M, preferably between 0.01 M and 1.0 M, and in particular between 0.01 M and 0.5 M.

Preference is given to using freshly prepared precursor solutions.

The molar use ratio of metal-containing reactant to the corresponding Se-, Te-, As-, S-, P-, O-containing compound in the precursor mixtures is expediently between 0.5 and 10.0, preferably between 0.7 and 5.0, and in particular between 0.9 and 2.0.

The use ratio of reactant 1 or 2 and the corresponding surfactant, which ratio determines the reactivity of the precursor solution, is expediently between 0.01 and 1, preferably between 0.05 and 0.8, and in particular between 0.06 and 0.5, in the particular precursor mixtures.

In a further embodiment of the process, precursor solutions are metered in along the reaction strand or the reaction section.

Precursor solution 1 is metered in along the reaction strand expediently at a concentration of the metal-containing reactant in the precursor solution of between 0.001 M and 2 M, preferably between 0.01 M and 1 M, and in particular between 0.01 M and 0.5 M.

Precursor solution 2 is metered in along the reaction strand by using expediently Se-, Te-, As-, S-, P-, O-containing compounds at a concentration in the precursor solution of between 0.001 M and 2 M, preferably between 0.01 M and 1 M, and in particular between 0.01 M and 0.5 M.

The metered-in concentrations of both precursor solutions must be chosen so as to prevent renewed nucleation or formation of new particles in the reactor.

Preference is given to employing freshly prepared precursor solutions.

The metered-in molar use ratio of metal-containing reactant to the corresponding Se-, Te-, As-, S-, P-, O-containing compound in the precursor mixture is expediently between 0.5 and 10.0, preferably between 0.7 and 5.0, and in particular between 0.9 and 2.0.

The use ratio of reactant 1 or 2 and the corresponding surfactant, which ratio determines the reactivity of the precursor solution when metered in, is expediently between 0.01 and 1, preferably between 0.05 and 0.8, and in particular between 0.06 and 0.5, in the particular precursor mixtures.

Where appropriate, further soluble substances such as, for example, low-molecular-weight additives, salts and surfactants may be added to the precursor solutions.

In the process according to the invention, nanoparticle synthesis and therefore particle property may also be controlled by adjusting and varying the process-engineering parameters such as experimental temperatures (heating-up rate, temperature of the residence section, cooling-off rate, etc.), volume flows and residence times and via mixing conditions. Additional metering-in sites along the reaction strand or the reaction section moreover allow preferably the precursor concentrations in the microreactor and in downstream reaction stages to be specifically adjusted and controlled.

The process according to the invention is suitable both for mixing- and temperature-initiated particle syntheses, since utilization of suitable microreaction technology components allows distinctly higher values both in material and in heat transfer processes (W. Ehrfeld et al., Microreactors, Wiley-VCH, 2000) than are achievable in batch or capillary reactors under ideal conditions. Furthermore, a further precursor solution (may be identical to the starting precursor solution) may be metered in in a controlled manner by using micromixers along the reaction strand or the reaction section, in order to adjust specifically form and size of the nanoparticles (e.g. synthesis of branched nanostructures) or to cover nanoparticles with an inorganic shell (core-shell nanoparticles) or to carry out desired doping reactions.

To initiate the particle-forming reaction, heat must be supplied via "solvothermal" processes, both in batch and in continuous synthesis of semiconductor nanoparticles.

For thermostatting, the capillary or microreactor may be placed in an oil bath in order to achieve in this way the required temperature increase. Microwave technology may also be utilized for rapidly heating up the reaction solution. However, preference is given to using microheat exchangers or heat exchangers integrated in microreactors, which provide markedly improved and controlled heat transfer and therefore more rapid and more efficient heating up of the reaction solution. Continuous processes with such thermostatting or mixing units have the advantage over batch or capillary processes of greatly simplifying scaling-up of production from a laboratory scale to a production scale due to the "numbering up" principle (rather than "scaling up"). Scaling-up may therefore be carried out while maintaining the product quality in comparison with a laboratory. Moreover, the microreaction technology modules used enable different temperature levels to be set along the reaction strand or the reaction section and thereby nucleation and growth to be separated in time and space.

Particular preference is given to using microheat exchangers or microreactors having an integrated static mixing function, in which the particle-forming reaction can be carried out under defined flow conditions, such as low axial and good radial mixing and, resulting therefrom, narrow residence time distribution, in continuous operation (e.g. sandwich reactor from Ehrfeld Mikrotechnik BTS GmbH).

The term "microreactor" is used here representing microstructured, preferably continuously operating reactors which are referred to as microreactor, minireactor, microheat exchanger, minimixer or micromixer. Examples of these are microreactors, microheat exchangers, T- and Y-mixers and micromixers of a large variety of companies (e.g. Ehrfeld Mikrotechnik BTS GmbH, Institut für Mikrotechnik Mainz GmbH, Siemens AG, CPC-Cellulare Process Chemistry Systems GmbH), "microreactor" or "microstructured" for the purpose of the present invention usually meaning components having characteristic/determining geometric dimensions of 1 µm-2000 µm, and particularly preferably of 10 µm-1000 µm.

The present invention relates to a liquid phase process for preparing nanoparticles and/or nanoparticle dispersions in a microreaction technology system, which process is characterized by the following steps:
  a) Injection into or passing through a microreaction technology system of a pre-mixed precursor solution containing at least one reactant (1 and/or 2) and at least one surfactant (1 and/or 2) with volume flow throughputs of preferably from 0.05 ml/min to 500 ml/min, preferentially from 0.5 ml/min to 250 ml/min, and in particular from 1.0 ml/min to 100 ml/min.
  b) Optionally injection or passing of a further precursor solution containing at least one further reactant (1 and/or 2) and at least one surfactant (1 and/or 2), and mixing of the two precursor solutions a) and b) via a suitable mixing element (e.g. micromixer) to give a reaction solution.
  c) Initiation of chemical reaction and in particular nucleation by heating rapidly the reaction solution consisting of at least 2 precursor solutions to a temperature at which reaction and nucleation take place to a significant extent, preferably to a temperature of more than 200° C., with temperatures of from 250° C. to 400° C., and in particular from 260° C. to 350° C., being preferred.
  d) Controlled growth of the nanoparticles by thermostatting/heating the reaction solution in a residence time reactor to a temperature of more than 150° C., the temperature being preferably between 180° C. and 280° C. and in particular between 220° C. and 280° C., with the temperature having to be lower than the temperature required for nucleation.
A particular embodiment of the process comprises in a further step
  e) stopping particle growth by cooling the reaction solution as abruptly as possible (quenching), with the cooling-off temperature being markedly lower than the temperature for nucleation and the growth temperature and not being allowed to exceed 150° C.

The process according to the invention for preparing the nanoscale functional particles is preferably carried out in a modular system consisting entirely of microreaction technology components, for example as depicted in FIG. 1, without being limited thereto. This system preferably consists of at least one thermostattable receptacle rinsed with inert gas (1), a microheat exchanger (2), a thermostattable microstructured residence time reactor with static mixing internals (3), a further microheat exchanger (4) for rapidly cooling the reaction solution and, where appropriate, an on-line analytical measuring point (5).

Particular preference is given here to pumping the reaction solution consisting of at least one precursor solution via pumps or high pressure pumps, for example HPLC pumps, with a constant flow rate and very low pulsation through the modular microreaction technology apparatus or through an apparatus composed of microstructured components. Particularly preferably, the first reaction strand or reaction section for carrying out reaction steps a) to e) is located upstream of a second reaction section which allows fresh precursor solution from a further thermostattable receptacle rinsed with inert gas (6) to be metered in to the reaction solution leaving the first reaction section. Both volume flows are preferably mixed in a microstructured mixer (7), making rapid and efficient mixing possible. The reaction solution enriched with fresh precursor solution is then passed through a further microheat exchanger (8), a thermostattable microstructured reactor with static mixing internals (9) and a microheat exchanger (10) for rapidly cooling the reaction solution. The second reaction strand may also be monitored via an on-line analytical measuring point.

The modularized construction, in contrast to completely integrated reactor systems (see WO 2005020659), has the advantage of optimal decoupling and therefore precise control of the individual process stages and, as a result, an even better possibility of specifically controlling and adjusting particle properties.

For continuous operation, particular process-engineering parameters such as, for example, selection of the microreactor or sequence of modules, are defined, others such as, for example, temperature, volume flows and concentrations (via metering-in) along the reaction section, may be varied and adjusted specifically during the process according to the invention. Thus, for example, the average residence times in the system are also controlled by way of regulating the volume flows.

The flow rates or volume flows of the reaction solution along a reaction strand or a reaction section are expediently within ranges from 0.05 ml/min to 500 ml/min, preferably from 0.5 ml/min to 250 ml/min, and in particular from 1.0 ml/min to 100 ml/min.

The microheat exchangers used here have a heat transfer area-to-reaction volume ratio (A/V ratio) expediently of at least 20 000 $m^2/m^3$, preferably at least 25 000 $m^2/m^3$ and in particular at least 30 000 $m^2/m^3$.

The microheat exchangers used for heating the reaction solution make temperatures of more than 200° C., preferably temperatures of from 250° C. to 400° C., and in particular from 260° C. to 350° C., possible.

In a particular embodiment of the process, step c) is carried out in the microheat exchanger (2) and the temperature increase in step c) is preferably achieved with the aid of a heat transfer area-to-reaction volume ratio (A/V ratio) of at least 20 000 $m^2/m^3$.

The residence times in the microheat exchanger used (2) are expediently within a range from 0.036 s to 360 s, preferably from 0.072 s to 36 s, and in particular from 0.18 s to 18 s. This corresponds to a flow rate/volume flow of the reaction solution of from 0.05 ml/min to 500 ml/min, preferably 0.5 ml/min to 250 ml/min, and in particular from 1.0 ml/min to 100 ml/min.

More specifically, the morphology of the nanoparticles can be controlled by the surfactants used, the concentrations of the reactants and surfactants and the molar use ratios of the particular reaction components (reactants and surfactants) to one another and also by controlling the temperature and the volume flows during the nucleation and growth processes.

In a particular embodiment of the process, nucleation (step c)) and particle growth (step d)) are stopped by abruptly cooling (quenching) the reaction solution. Preference is given to setting in this manner a temperature for the reaction solution of less than 150° C., particularly preferably a temperature from 0 to 100° C., and in particular from 0 to 50° C.

In a particular embodiment of the process, step d) is carried out in thermostattable microstructured reactors with static mixing internals (3). Thermostattable microstructured reactors with static mixing internals (3) which are employed expediently are continuously operated reactors having a heat transfer area-to-reaction volume ratio (A/V ratio) of at least 800 $m^2/m^3$, preferably 1000 $m^2/m^3$, and in particular having a ratio of at least 1200 $m^2/m^3$. The temperature set for controlled growth is usually more than 150° C., preferably between 180° C. and 280° C., and in particular between 220° C. and 280° C. Preferably, the temperature in the reactor (3) is here equal to or lower than the temperature in step c) (nucleation) and is preferably reached with the aid of an A/V ratio of at least 1000 $m^2/m^3$.

Owing to low axial and good radial mixing, the static mixing internals provide optimal heat transfer and a narrow residence time distribution. The average residence times in the reactors used are expediently between 10 s and 300 s, preferably between 60 s and 600 s, and in particular between 90 s and 1200 s. This corresponds to a flow rate/volume flow of the reaction solution of from 0.05 ml/min to 500 ml/min, preferably 0.5 ml/min to 250 ml/min, and in particular from 1.0 ml/min to 100 ml/min.

Due to the fact that the residence time distribution in the microstructured reactors used (3) is, due to the static mixing internals, distinctly narrower than in a tube or a capillary, it is thus possible to synthesize specifically nanoparticles with a narrow particle size distribution. The reactor (3) is preferably used for even and defined growth of the nanoparticle nuclei formed in stage c) up to nanoparticles of the desired size. The size here may be controlled via the chemical parameters and/or, preferably, via temperature and volume flows.

In a particular embodiment of the process, the temperature is quickly lowered in step e) preferably with the aid of a downstream microheat exchanger (4) with an A/V ratio of at least 20 000 $m^2/m^3$.

Preference is given to producing in the first reaction section described previously nanoparticles with a maximum characteristic dimension (e.g. diameter in the case of round nanoparticles) of 10 nm. To prepare monodispersely distributed relatively large nanoparticles, branched nanostructures, doped nanoparticles or core-shell structures in a controlled manner, it is advantageous to further treat/to modify the nanoparticles formed in the first reaction section via the following steps:

f) Injection of at least one fresh precursor solutions via a suitable mixing element (e.g. micromixer).
g) Repeat of steps d) and e).

The second reaction section is utilized preferably for preparing core-shell nanoparticles, doped nanoparticles, nanorods, nanoplates, nanotetrapods or polybranched nanostructures, since it enables ideal reaction conditions (temperature, residence time, concentration, etc.) to be set and controlled separately. Utilizing a second reaction section (downstream of the first section) also allows larger, but monodispersely distributed spherical nanoparticles to be prepared.

If the precursor solutions in step f) are identical to the precursor solutions of steps a) and b), larger or branched nanostructures (e.g. nanorods or nanotetrapods) can be synthesized.

If the precursor solutions in step f) are not identical to the precursor solutions of steps a) and b), core-shell structures or doped nanoparticles may be formed. In this case it is furthermore also possible to prepare polybranched nanostructures from various materials.

Preferably, the second reaction section has a micromixer for carrying out step f), a microstructured heat exchanger and a thermostattable microstructured reactor with static mixing internals and also a downstream heat exchanger whose properties are equivalent to the properties of the microreaction technology components of the first reaction section.

In a further embodiment of the process, the second reaction section is upstream of a working-up section. A suitable solvent (precipitant or anti-solvent) for temporary reversible precipitation of the nanoparticles is taken from a receptacle (11) and mixed with the reaction solution leaving either of the two reaction sections, preferably in a microstructured mixer (12) which makes rapid and efficient mixing possible. The nanoscale particles can then be removed in a further stage (13).

The micromixers used in the second reaction section and in the working-up section have a mixing time of expediently less than 10 s, preferably less than 5 s, and in particular less than 0.5 s. The mixing time here describes the time interval required for homogenizing the reaction solution.

The present invention therefore likewise relates to a preferably continuous process, characterized in that the synthesis of functional metallic nanoparticles or semiconductor nanoparticles (first reaction section) as well as their further modification to give core-shell nanoparticles, doped nanoparticles, nanorods, nanoplates, nanotetrapods and polybranched nanostructures (second reaction section with metering-in), and also working-up of the synthesized nanostructures (working-up section) are integrated in a modular microreaction technology system.

Dissolved accompanying substances such as excess surfactants and unreacted precursors may be removed and the nanoparticle dispersion may be concentrated by utilizing commonly used processes such as, for example, ultrafiltration, membrane filtration, dialysis and centrifugation. Moreover, the use of a suitable solvent (precipitant or anti-solvent), for specific induction of reversible aggregation and sedimentation of nanoparticles, allows removal from the reaction solution.

In a further optimized embodiment of the process, these separation processes may be run continuously and follow the already integrated working-up section.

According to the process of the invention, the nanoparticle dispersion may be concentrated and, where appropriate, purified by means of standard processes (e.g. ultrafiltration, membrane filtration, dialysis, centrifugation and evaporation).

A washing step or the addition of additives may, where appropriate, optimize or specifically vary the colloidally chemical stability and application properties of the nanoparticle dispersion.

Finally, the nanoparticle dispersion may be prepared in a further step of the process according to the invention by redispersing the nanoparticles in a suitable solvent (e.g. toluene, chloroform, dichloromethane, chlorobenzene or butyl acetate).

The nanoparticles were characterized by determining particle size, particle size distribution and particle morphology by means of transmission electron microscopy (TEM, Philips CM 20). Measurement processes such as dynamic light scattering (hydrodynamic particle size, Brookhaven BIC-90 Plus) and UV/VIS spectroscopy (Hewlett Packard Diode Array Spectrophotometer 8452A) are also suitable for characterizing nanoscale particles.

The process may be used for continuous preparation of nanoscale metal-containing particles and semiconductor particles and their dispersions or formulations, for example for catalysts, coating materials, thin functional layers, materials for electronics, materials with particular optical properties, solar cells, biolabels, preparation of semi-conductive or conductive nano- and microstructures, materials for anti-counterfeit methods, for dyeing plastic materials and for plastic composites with special properties.

FIGURES

FIG. 1: Schematic representation of the process

FIG. 1 depicts a schematic representation of the apparatus for carrying out continuous synthesis of functional nanoparticles, without being limited thereto.

Figure 2:
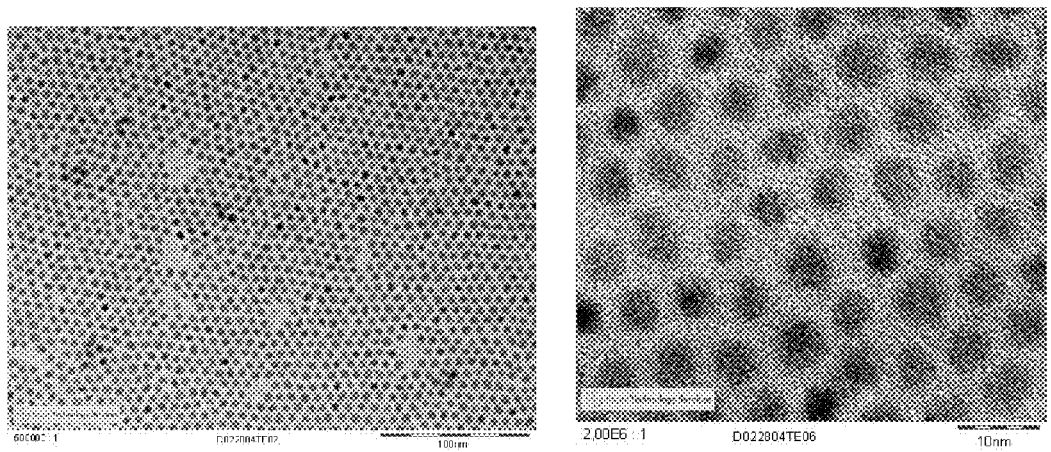

Reference numbers:
1. Reaction section
1—Thermostatted receptacle for precursor solutions (solvents, surfactants, precursors)
2—Microheat exchanger (abrupt temperature increase)
3—Thermostatted, microstructured reactor with static mixing internals
4—Microheat exchanger (abrupt temperature decrease)
5—Online analysis
2. Reaction section
6—Thermostatted receptacle for precursor solutions (solvents, surfactants, precursors)
7—Micromixer
8—Microheat exchanger (abrupt temperature increase)
9—Thermostatted, microstructured residence time reactor with static mixing internals
10—Microheat exchanger (abrupt temperature decrease)
3. Working-up section
11—Receptacle (precipitant or anti-solvent)
12—Micromixer
13—Separator (removal of aggregated nanoparticles)
14—Redispersion of nanoparticles in a suitable solvent FIG. 2: TEM image of cadmium selenide (CdSe) nanoparticles prepared according to Example 1.

Figure 3:
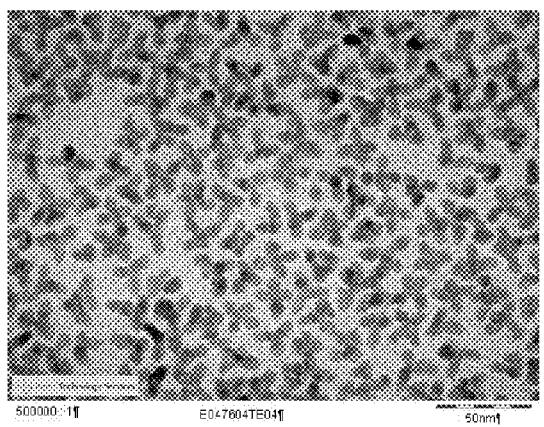

FIG. 3: TEM image of branched cadmium selenide (CdSe) nanoparticles prepared according to Example 2.

Figure 4:
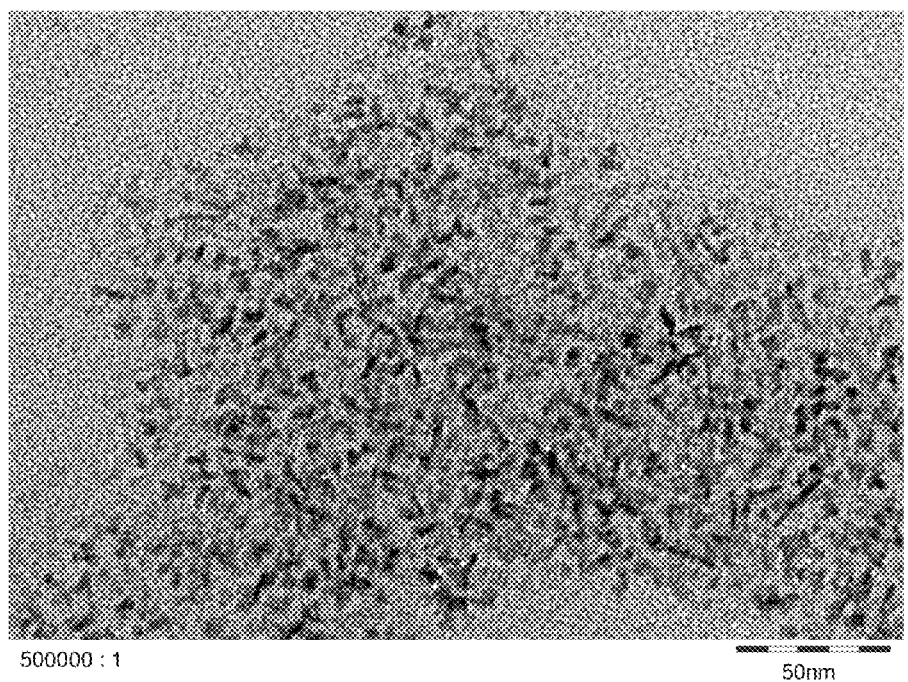

FIG. 4: TEM image of indium phosphide (InP) nanoparticles prepared according to Example 3.

Figure 5:
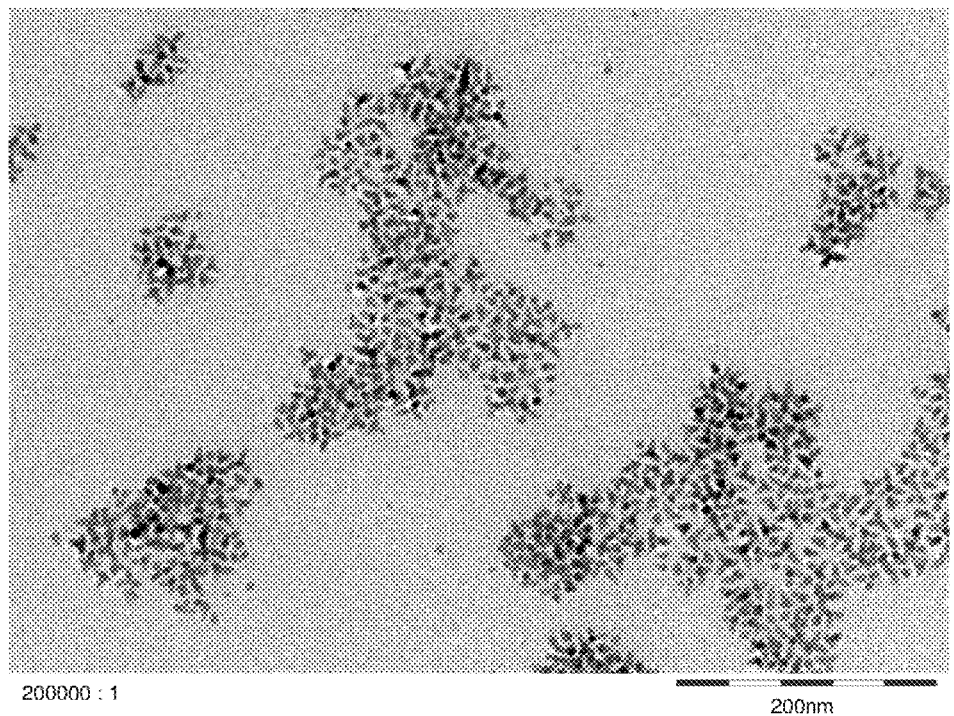
Figure 5:
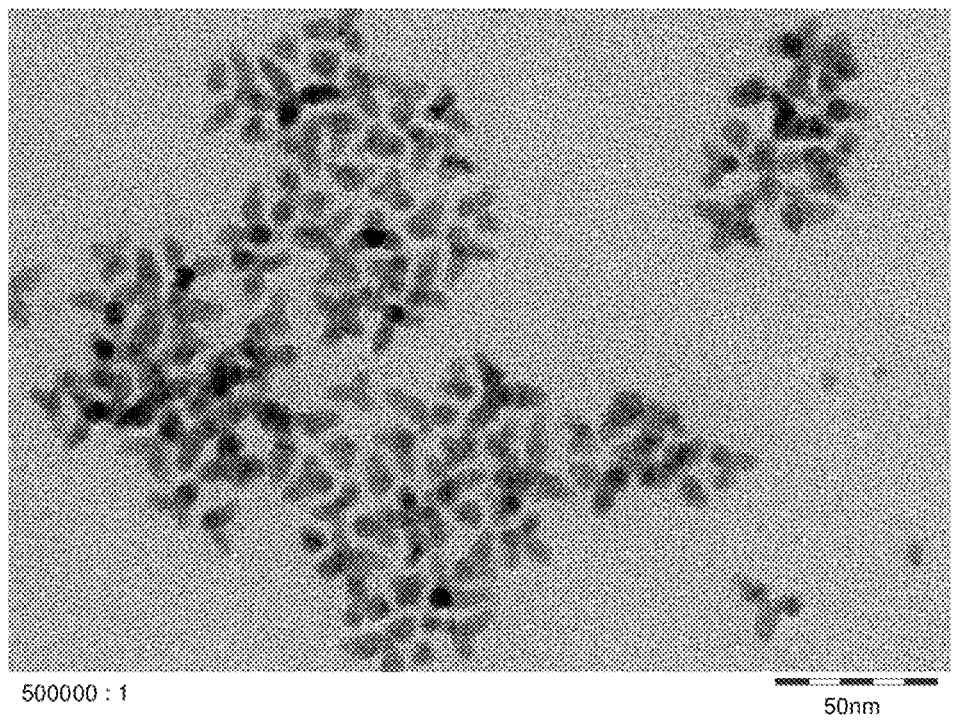

FIG. 5: TEM image of branched cadmium telluride (CdTe) nanoparticles prepared according to Example 4.

Figure 6:
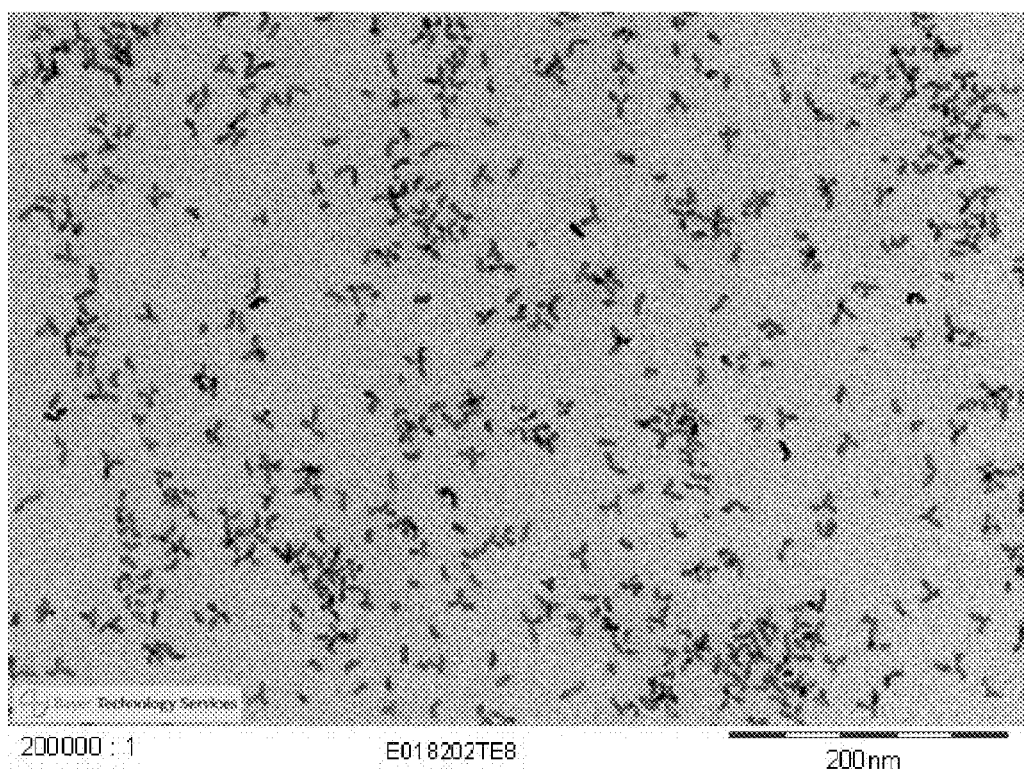

FIG. 6: TEM image of zinc selenide (ZnSe) nanoparticles prepared according to Example 5.

Figure 7:
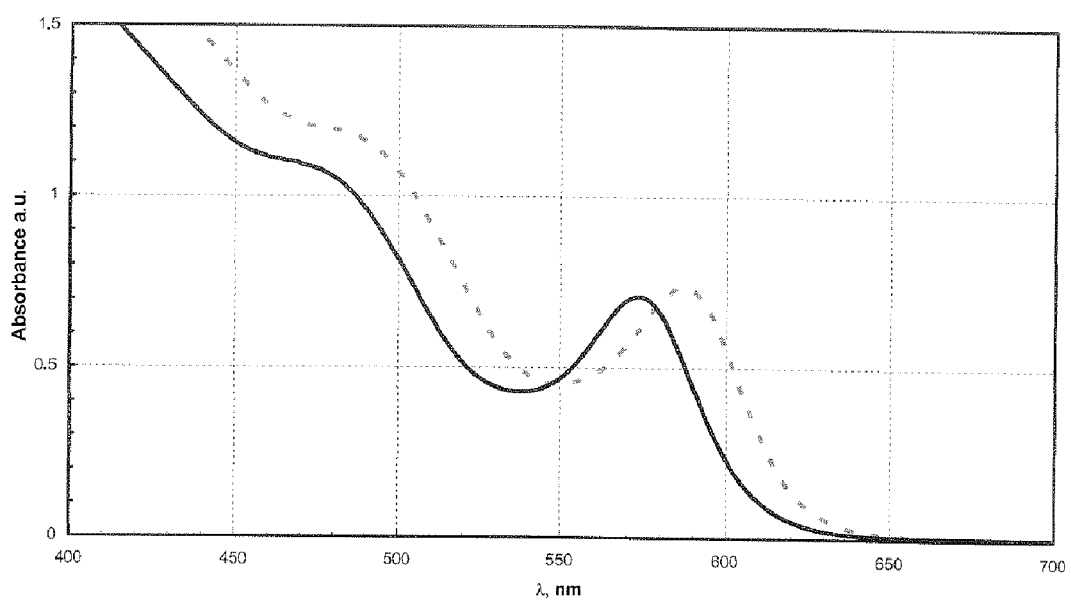

FIG. 7: UV/VIS spectrum of CdSe nanoparticles in toluene, prepared with two different volume flows according to Example 1. The dashed line indicates the spectrum of the nanoparticles prepared with a volume flow of 4.6 ml/min and a residence time $\tau$ of 6.5 min, while the continuous line indicates the spectrum of the nanoparticles prepared with a volume flow of 9.9 ml/min and a residence time $\tau$ of 3 min. The experimental temperatures here were 260° C. in the microheat exchanger and 260° C. in the residence time reactor.

Figure 8:
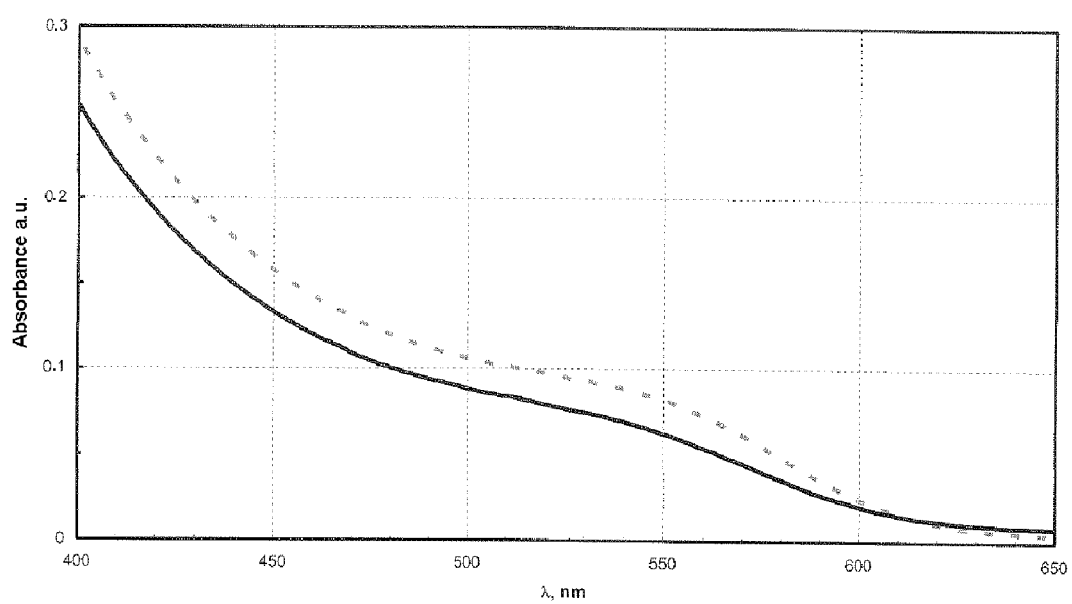

FIG. 8: UV/VIS spectrum of InP nanoparticles in toluene, prepared with two different volume flows according to Example 3. The dashed line indicates the spectrum of the nanoparticles prepared with a volume flow of 4.6 ml/min and a residence time $\tau$ of 6.5 min, while the continuous line indicates the spectrum of the nanoparticles prepared with a volume flow of 9.9 ml/min and a residence time $\tau$ of 3 min. The experimental temperatures here were 300° C. in the microheat exchanger and 270° C. in the residence time reactor.

Figure 9:
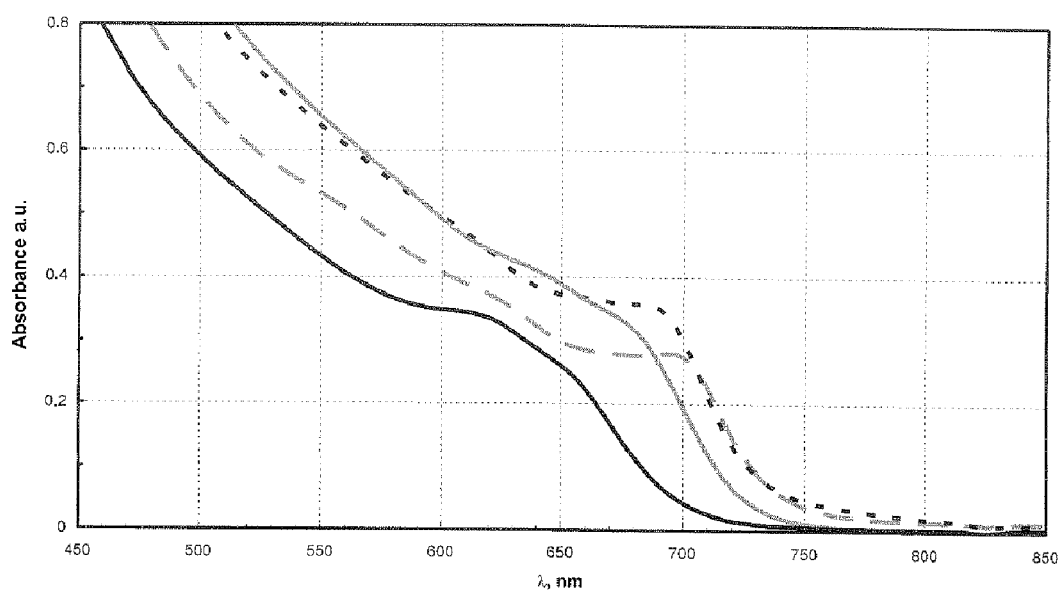

FIG. 9: UV/VIS spectrum of branched CdTe nanoparticles in toluene, prepared with two different volume flows and temperatures according to Example 4. The short-dashed black line indicates the spectrum of the nanoparticles prepared with a volume flow of 9.9 ml/min and a residence time $\tau$ of 3 min, while the grey long-dashed line indicates the spectrum of the nanoparticles prepared with a volume flow of 4.6 ml/min and a residence time $\tau$ of 6.5 min. The experimental temperatures here were 300° C. in the microheat exchanger and 230° C. in the residence time reactor.

The continuous black line indicates the spectrum of the nanoparticles prepared with a volume flow of 9.9 ml/min and a residence time $\tau$ of 3 min, while the grey continuous line indicates the spectrum of the nanoparticles prepared with a volume flow of 4.6 ml/min and a residence time $\tau$ of 6.5 min. The experimental temperatures here were 270° C. in the microheat exchanger and 200° C. in the residence time reactor.

The present invention will be illustrated by the following examples, without being limited thereto.

EXAMPLES

Example 1

Preparation of CdSe Nanoparticles

A 0.5 molar selenium solution (solvent trioctylphosphane) was prepared (39.5 g of selenium/l of TOP). For the second precursor solution, 0.03 mol of cadmium oxide (CdO) was dissolved per liter of oleic acid/Diphyl THT (weight ratio of 1/5) mixture. To completely dissolve CdO, the second precursor solution must be heated to at least 220° C. After cooling the CdO precursor solution, it was possible to mix both precursor solutions in a 1/10 weight ratio in a receptacle at room temperature or slightly elevated temperature. The reaction solution consisting of both previously mixed precursor solutions was then passed with a total volume flow of 10 ml/min through the modular microreaction technology system (Ehrfeld Mikrotechnik BTS GmbH), using an HPLC double-piston pump.

The thermostatting medium on the first microheat exchanger (counterflow microheat exchanger, V≈0.3 ml, A≈0.0076 m², Ehrfeld Mikrotechnik BTS GmbH) had a temperature of 330° C., while the thermostatting medium for the microstructured reactor (sandwich reactor, V≈30 ml, A≈0.03 m², Ehrfeld Mikrotechnik BTS GmbH) had a temperature of 260° C.

The reaction solution containing the nanoparticles formed (visible by way of colouring of the reaction solution) was cooled to 50° C. with the aid of the second microheat exchanger (counterflow microheat exchanger or tube thermostatting module, Ehrfeld Mikrotechnik BTS GmbH) and collected in a product container. The nanoparticles were removed by adding a solvent (precipitant/anti-solvent, for example methanol/propanol mixture) which induces reversible aggregation of the nanoparticles. Removal of the supernatant was followed by redispersion in toluene, chloroform or another suitable solvent. This may be followed by any type of characterization of the nanoparticles (TEM and UV/VIS analysis, see FIGS. 2 and 7).

Example 2

Preparation of Branched CdSe Nanoparticles

A 0.3 molar selenium solution (solvent trioctylphosphane) was prepared (25 g of selenium/l of TOP). To this solution a second surfactant solution consisting of cetyltrimethylammonium bromide (CTAB) and Diphyl THT was added (13 g of CTAB/l of Diphyl THT). Both solutions form the first precursor solution with a 1/1 weight ratio. For the second precursor solution, 0.07 mol of cadmium oxide (CdO) was dissolved per liter of oleic acid/Diphyl THT (1/4 weight ratio) mixture. To completely dissolve CdO, the second precursor solution must be heated to at least 220° C. After cooling the CdO precursor solution, it was possible to mix both precursor solutions in a 1/3 weight ratio in a receptacle at room temperature or slightly elevated temperature. The reaction solution consisting of both previously mixed precursor solutions was then passed with a total volume flow of 10 ml/min through the modular microreaction technology system (Ehrfeld Mikrotechnik BTS GmbH), using an HPLC double-piston pump.

The thermostatting medium on the first microheat exchanger (counterflow microheat exchanger, $V \approx 0.3$ ml, $A \approx 0.0076 \, m^2$, Ehrfeld Mikrotechnik BTS GmbH) had a temperature of 330° C., while the thermostatting medium for the microstructured reactor (sandwich reactor, $V \approx 30$ ml, $A \approx 0.03 \, m^2$, Ehrfeld Mikrotechnik BTS GmbH) had a temperature of 280° C.

The reaction solution containing the nanoparticles formed (visible by way of colouring of the reaction solution) was cooled to 50° C. with the aid of the second microheat exchanger (counterflow microheat exchanger or tube thermostatting module, Ehrfeld Mikrotechnik BTS GmbH) and collected in a product container. The nanoparticles were removed by adding a solvent (precipitant/anti-solvent, for example methanol/propanol mixture) which induces reversible aggregation of the nanoparticles. Removal of the supernatant was followed by redispersion in toluene, chloroform or another suitable solvent. This may be followed by any type of characterization of the nanoparticles (TEM analysis, see FIG. 3).

Example 3

Preparation of InP Nanoparticles

A 0.04 molar tris(trimethylsilyl)phosphane $(P(TMS)_3)$ solution (solvent Diphyl THT) was prepared (10 g of $P(TMS)_3$/l of Diphyl THT). For the second precursor solution, 0.03 mol of indium acetate $(In(Ac)_3)$ was dissolved per liter of oleic acid/Diphyl THT (1/30 weight ratio) mixture. To completely dissolve $In(Ac)_3$, the second precursor solution must be heated to at least 120° C. After cooling the $In(Ac)_3$ precursor solution, it was possible to mix both precursor solutions in a 1/2 weight ratio in a receptacle at room temperature or slightly elevated temperature. The reaction solution consisting of both previously mixed precursor solutions was then passed with a total volume flow of 10 ml/min through the modular microreaction technology system (Ehrfeld Mikrotechnik BTS GmbH), using an HPLC double-piston pump.

The thermostatting medium on the first microheat exchanger (counterflow microheat exchanger, $V \approx 0.3$ ml, $A \approx 0.0076 \, m^2$, Ehrfeld Mikrotechnik BTS GmbH) had a temperature of 300° C., while the thermostatting medium for the microstructured reactor (sandwich reactor, $V \approx 30$ ml, $A \approx 0.03 \, m^2$, Ehrfeld Mikrotechnik BTS GmbH) had a temperature of 270° C.

The reaction solution containing the nanoparticles formed (visible by way of colouring of the reaction solution) was cooled to 50° C. with the aid of the second microheat exchanger (counterflow microheat exchanger or tube thermostatting module, Ehrfeld Mikrotechnik BTS GmbH) and collected in a product container. The nanoparticles were removed by adding a solvent (precipitant/anti-solvent, for example methanol/propanol mixture) which induces reversible aggregation of the nanoparticles. Removal of the supernatant was followed by redispersion in toluene, chloroform or another suitable solvent. This may be followed by any type of characterization of the nanoparticles (TEM and UV/VIS analysis, see FIGS. 4 and 8).

Example 4

Preparation of Branched CdTe Nanoparticles

A 0.025 molar tellurium (Te) solution (solvent Diphyl THT) was prepared (3.2 g of tellurium/l of TBP/Diphyl THT mixture in a 1/28 weight ratio). For the second precursor solution, 0.025 mol of cadmium oxide (CdO) was dissolved per liter of oleic acid/Diphyl THT (1/30 weight ratio) mixture. To completely dissolve CdO, the second precursor solution had to be heated to at least 220° C. After the CdO precursor solution had cooled down, it was possible to mix both precursor solutions in a receptacle at room temperature or slightly elevated temperature. The reaction solution consisting of both previously mixed precursor solutions was then passed with a total volume flow of 10 ml/min through the modular microreaction technology system (Ehrfeld Mikrotechnik BTS GmbH), using an HPLC double-piston pump.

The thermostatting medium on the first microheat exchanger (counterflow microheat exchanger, $V \approx 0.3$ ml, $A \approx 0.0076 \, m^2$, Ehrfeld Mikrotechnik BTS GmbH) had a temperature of 330° C., while the thermostatting medium for the microstructured reactor (sandwich reactor, $V \approx 30$ ml, $A \approx 0.03 \, m^2$, Ehrfeld Mikrotechnik BTS GmbH) had a temperature of 260° C.

The reaction solution containing the nanoparticles formed (visible by way of colouring of the reaction solution) was cooled to 50° C. with the aid of the second microheat exchanger (counterflow microheat exchanger or tube thermostatting module, Ehrfeld Mikrotechnik BTS GmbH) and collected in a product container. The nanoparticles were removed by adding a solvent (precipitant/anti-solvent, for example methanol/propanol mixture) which induces reversible aggregation of the nanoparticles. Removal of the supernatant was followed by redispersion in toluene, chloroform or another suitable solvent. This may be followed by any type of characterization of the nanoparticles (TEM and UV/VIS analysis, see FIGS. 5 and 9).

Example 5

Preparation of ZnSe Nanoparticles

A 1 molar selenium solution (solvent trioctylphosphane) was prepared (96 g of selenium/l of TOP) and diluted with Diphyl THT in a 2/1 weight ratio. For the second precursor solution, 0.025 mol of zinc stearate ($ZnSt_2$) was dissolved per liter of Diphyl THT. To completely dissolve $ZnSt_2$, the second precursor solution must be heated to at least 200° C. After the $ZnSt_2$ precursor solution had cooled, it was possible to mix both precursor solutions in a 1/5 weight ratio in a receptacle at room temperature or slightly elevated temperature (approx. 100° C.). The reaction solution consisting of both previously mixed precursor solutions was then passed with a total volume flow of 10 ml/min through the modular microreaction technology system (Ehrfeld Mikrotechnik BTS GmbH), using an HPLC double-piston pump.

The thermostatting medium on the first microheat exchanger (counterflow microheat exchanger, $V \approx 0.3$ ml, $A \approx 0.0076$ m$^2$, Ehrfeld Mikrotechnik BTS GmbH) had a temperature of 330° C., while the thermostatting medium for the microstructured reactor (sandwich reactor, $V \approx 30$ ml, $A \approx 0.03$ m$^2$, Ehrfeld Mikrotechnik BTS GmbH) had a temperature of 300° C.

The reaction solution containing the nanoparticles formed (visible by way of colouring of the reaction solution) was cooled to 50° C. with the aid of the second microheat exchanger (counterflow microheat exchanger or tube thermostatting module, Ehrfeld Mikrotechnik BTS GmbH) and collected in a product container. The nanoparticles were removed by adding a solvent (precipitant/anti-solvent, for example methanol/propanol mixture) which induces reversible aggregation of the nanoparticles. Removal of the supernatant was followed by redispersion in toluene, chloroform or another suitable solvent. This may be followed by any type of characterization of the nanoparticles (TEM analysis, see FIG. 6).

The invention claimed is:

1. A liquid phase process for preparing metal-containing nanoparticles and/or nanoparticle dispersions in a reactor, wherein nucleation and growth processes are separated in time and space by controlling the temperature and the volume flows.

2. The process according to claim 1, wherein the process is carried out in a microreaction technology system.

3. The process according to claim 2, wherein the process is carried out in a modular microreaction technology system.

4. A liquid phase process for preparing metal-containing nanoparticles and/or nanoparticle dispersions in a microreactor comprising the following steps:
   a) injecting into or passing through a microreaction technology system of a pre-mixed first precursor solution containing at least one reactant (1 and/or 2) and at least one surfactant (1 and/or 2) with volume flow throughputs of preferably from 0.05 ml/min to 500 ml/min,
   b) optionally injecting or passing of a second precursor solution containing at least one further reactant and at least one surfactant, and mixing of the first and second precursor solutions via a suitable mixing element to give a reaction solution,
   c) initiating a chemical reaction by heating rapidly the reaction solution comprising the first and second precursor solutions to a temperature at which reaction and nucleation take place to a significant extent,
   d) controlling growth of the nanoparticles by thermostatting/heating the reaction solution in a residence time reactor to a temperature of more than 150° C., with the temperature having to be lower than the temperature required for nucleation.

5. The process according to claim 4, wherein, in a step e), particle growth is stopped abruptly by cooling the reaction solution, with the cooling temperature being lower than the nucleation temperature and the growth temperature.

6. The process according to claim 4, wherein the process is carried out continuously.

7. The process according to claim 4, wherein the temperature increase for step c) is achieved in a microheat exchanger with the aid of a heat transfer area-to-reaction volume ratio (A/V ratio) of at least 20 000 m$^2$/m$^3$.

8. The process according to claim 4, wherein the temperature for step d) in the microstructured reactor is maintained with the aid of an A/V ratio of at least 1000 m$^2$/m$^3$ and the residence time distribution thereof is distinctly narrower than in a tube or in a capillary, due to the use of static mixing internals.

9. The process according to claim 4, wherein, in step e), particle growth in a microheat exchanger is stopped by abruptly lowering the temperature, with an A/V ratio of at least 20 000 m$^2$/m$^3$.

10. The process according to claim 4 for the synthesis of core-shell nanoparticles, doped nanoparticles, nanorods, nanoplates, nanotetrapods or polybranched nanostructures, wherein fresh precursor solution is metered in and step d) is repeated in a step f) which can be repeated any number of times.

11. The process according to claim 4, wherein the nanoparticles prepared have a characteristic average particle dimension of up to 40 nm and a 0D, 1D, 2D or 3D structure.

12. The process according to claim 4, wherein the particle size distribution has a standard deviation of ±10 nm.

13. The process according to claim 4 wherein the temperature at which reaction and nucleation take place is more than 200° C.

14. The process according to claim 4 wherein the nanoparticles property distribution does not exceed a standard deviation of ±20%.

* * * * *